US008243461B2

(12) United States Patent
Uchida et al.

(10) Patent No.: US 8,243,461 B2
(45) Date of Patent: Aug. 14, 2012

(54) ELECTRONIC DEVICE AND PROCESS FOR MANUFACTURING ELECTRONIC DEVICE

(75) Inventors: Kenji Uchida, Kawasaki (JP); Koki Hirasawa, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 111 days.

(21) Appl. No.: 12/630,466

(22) Filed: Dec. 3, 2009

(65) Prior Publication Data

US 2010/0142169 A1 Jun. 10, 2010

(30) Foreign Application Priority Data

Dec. 4, 2008 (JP) .................................. 2008-309276

(51) Int. Cl.
*H05K 7/00* (2006.01)
(52) U.S. Cl. ........................................ 361/760; 361/829
(58) Field of Classification Search .................. 361/760, 361/761, 829; 257/666, 680, 704; 174/250
See application file for complete search history.

(56) References Cited

U.S. PATENT DOCUMENTS

| 7,276,393 | B2 * | 10/2007 | Derderian et al. | 438/51 |
| 7,397,023 | B2 * | 7/2008 | Tsukamoto et al. | 250/239 |
| 7,813,043 | B2 * | 10/2010 | Lusinchi et al. | 359/619 |
| 2003/0141948 | A1 * | 7/2003 | Maekawa et al. | 333/204 |
| 2004/0094825 | A1 * | 5/2004 | Onishi et al. | 257/666 |
| 2009/0027869 | A1 * | 1/2009 | Uchida et al. | 361/829 |
| 2009/0147115 | A1 * | 6/2009 | Tanida et al. | 348/294 |

FOREIGN PATENT DOCUMENTS

| JP | 4-69958 A | 3/1992 |
| JP | 7-202152 A | 8/1995 |
| JP | 2001-257334 A | 9/2001 |
| JP | 2008-197357 A | 8/2008 |
| KR | 10-2006-0104949 A | 10/2006 |

* cited by examiner

*Primary Examiner* — Yuriy Semenenko
(74) *Attorney, Agent, or Firm* — Sughrue Mion, PLLC

(57) ABSTRACT

The electronic device, which allows inhibiting the breaking-away of the element from the frame member, even if the temperature change of the electronic device is repeated, and the process for manufacturing the electronic device, are achieved. An electronic device includes a photo-sensitive element formed in a wafer, a frame member installed on the wafer to surround a functional unit, and an encapsulating resin layer filling a circumference of the frame member.

12 Claims, 7 Drawing Sheets

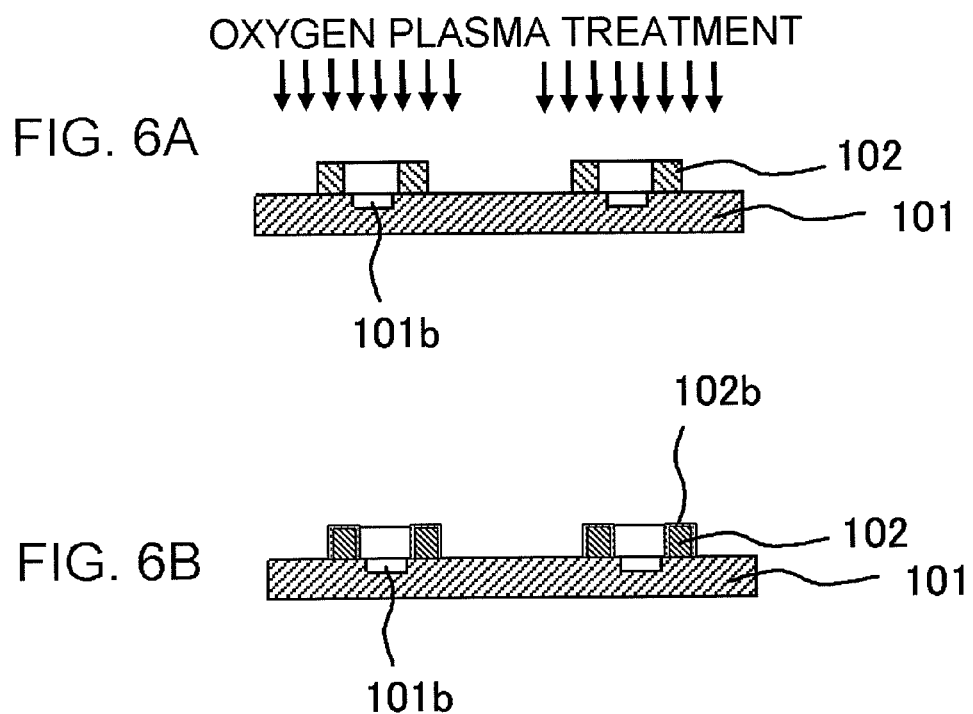
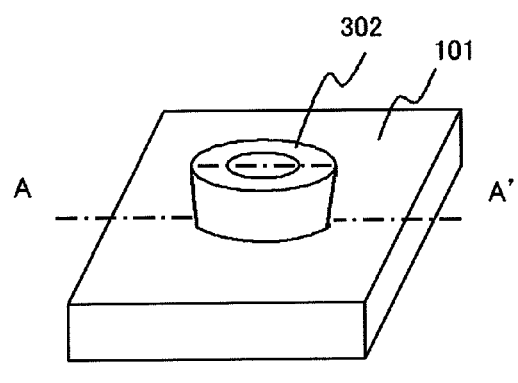
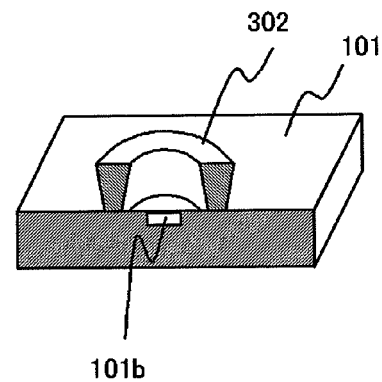

ELECTRONIC DEVICE AND PROCESS FOR MANUFACTURING ELECTRONIC DEVICE

This application is based on Japanese patent application No. 2008-309,276, the content of which is incorporated hereinto by reference.

BACKGROUND

1. Technical Field

The present invention relates to an electronic device and a process for manufacturing an electronic device.

2. Background Art

Electronic devices employing optical devices, which convert optical signal into electrical signal, include a photo acceptor unit of the optical device, which directly receives optical signal entered from an external source. Requirements such as an inhibition of an attenuation of optical signal, or an improvement in humidity resistance of the electronic device or an achievement of a compatibility with reflow conditions in lead-free packaging process by employing a black resin, are demanded in such electronic device.

Epoxy resin is particularly employed in a light-receiving device, which converts the optical signal into electrical signal in the optical recording technology utilizing blue light for the optical signal. Thus, the use of the epoxy resin over the optical path for the optical device photo acceptor unit leads to a deterioration of the epoxy resin due to the exposure to blue light to reduce the light transmission characteristics, causing a problem of unserviceable condition.

In such situation, an electronic device is employed, in which a frame member provided in the circumference of the photo acceptor unit is provided for the purpose of inhibiting an attenuation of optical signal in the photo acceptor unit of the optical device, and the circumference of the frame member is encapsulated with a resin.

Japanese Patent Laid-Open No. 2001-257,334 describes a solid-state imaging device, in which an epoxy resin sheet 4 having an aperture section 3 only in a photo acceptor unit is adhered to a solid-state image sensing element chip 1 with an adhesive agent 5, and a transparent member 6 is adhered on the epoxy resin sheet 4 with the adhesive agent 5 (FIG. 9). It is also described that the solid-state image sensing element chip 1 is die-bonded to a substrate 10, and a predetermined coupling between the substrate 10 and a pad section 1a of the solid-state image sensing element chip 1 is achieved with bonding wires 11.

As shown in FIG. 9, a peripheral section including a bonding wire coupling section except a hermetic seal section is encapsulated with a resin with an encapsulating resin 12. In this configuration, the epoxy resin sheet 4 corresponds to a frame member surrounding the photo acceptor unit.

However, a long term use of the electronic device that employs the technology disclosed in Japanese Patent Laid-Open No. 2001-257,334 causes a problem of creating a breaking-away in the adhesion surface between the frame member and an element.

SUMMARY

A possible cause for creating the aforementioned breaking-away in the adhesion surface between the frame member and an element is clarified by the present inventors. The possible cause will be described hereinafter. The uses of the electronic device ordinarily cause repeated cycles of high-temperature conditions and low-temperature conditions, so that thermal expansions and thermal shrinkages of the elements and the frame member and the encapsulating resin are also repeated. Since the linear expansion coefficient of the frame member is different from the linear expansion coefficient of the encapsulating resin, a free thermal expansion and/or free thermal shrinkage of the frame member cannot be achieved due to the presence of the encapsulating resin adhered around the frame member, and further, a stress from the encapsulating resin is exerted over the frame member. Therefore, a stress is accumulated in the interior of the frame member. It is considered that such accumulated stress causes a breaking-away of the adhesion interface between the frame member and the element, which has smaller dimensional area than the cohesive interface of the frame member and the encapsulating resin.

According to one aspect of the present invention, there is provided an electronic device, comprising: an element formed in a wafer; a frame member, composed of a first resin and installed over the wafer to surround a functional unit of the element; and a resin layer, composed of a second resin, and provided so as to fill the circumference of the frame member so that a gap is present between the frame member and the resin layer.

According to another aspect of the present invention, there is provided a process for manufacturing an electronic device, including: forming a frame member over a wafer having a plurality of elements formed therein, the frame member being composed of a first resin and being installed over the wafer to surround a functional unit of the element; deforming the frame member so as to enlarge a width of the frame member by pressing a molding surface of a metallic mold for an encapsulation against an upper surface of the frame member; injecting the second resin into the interior of the encapsulating metallic mold while the frame member is deformed; and disassembling the encapsulating metallic mold to deform the enlarged width of the frame member again returning to the previous dimension.

In the above-described configuration according to the present invention, a gap is present between the frame member and the resin layer. The presence of the gap allows thermal expansion and thermal shrinkage of the frame member and the resin layer. Therefore, the stress from the resin layer to the frame member is relaxed, so that the stress is hardly accumulated in the inside of the frame member. This allows inhibiting the breaking-away of the element from the frame member, even if the temperature change of the electronic device is repeated.

According to the present invention, the electronic device, which allows inhibiting the breaking-away of the element from the frame member, even if the temperature change of the electronic device is repeated, and the process for manufacturing the electronic device, are achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 6A and 6B are cross-sectional views, illustrating partial process for manufacturing the electronic device according to second embodiment.

FIG. 7A is a perspective view, illustrating an electronic device in an embodiment, and FIG. 7B is a cross-sectional view along line A-A' shown in FIG. 7A;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of electronic devices and processes for manufacturing thereof according to the present invention will be described in detail as follows in reference to the annexed figures. In the figures, an identical numeral is assigned to an element commonly appeared in the figures, and the detailed description thereof will not be repeated.

First Embodiment

Figure 1A:
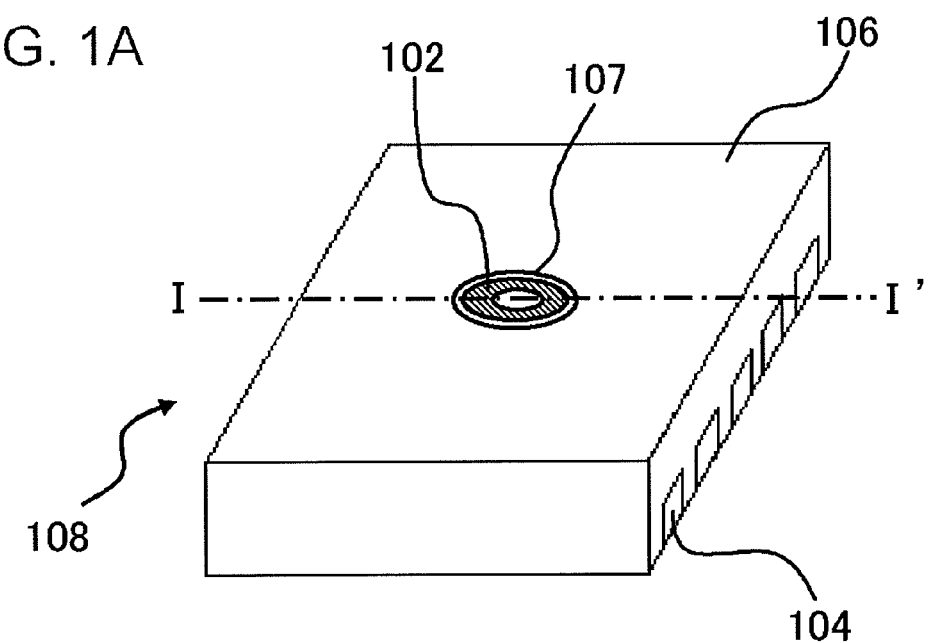
FIG. 1A is a perspective view, illustrating an electronic device in an embodiment.
Figure 1B:
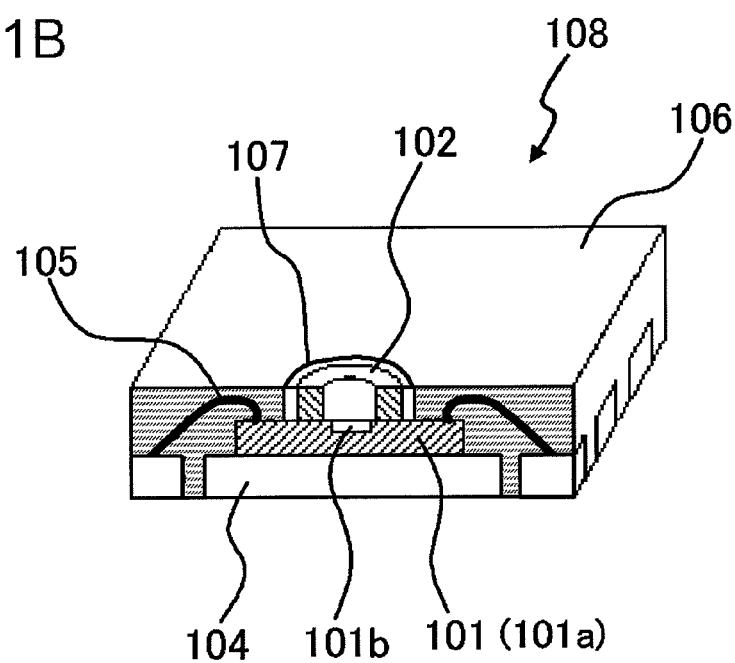
FIG. 1B is a cross-sectional view along line I-I' shown in FIG. 1A.

FIG. 1A is a perspective view, illustrating an electronic device according to first embodiment, and FIG. 1B is a cross-sectional view along line I-I' in FIG. 1A. FIGS. 2A to 2D, FIGS. 3A to 3C and FIGS. 4A to 4C are cross-sectional views, illustrating a process for manufacturing the electronic device according to first embodiment.

An electronic device 108 includes a photo-sensitive element 101 formed in a wafer 101a, a frame member 102 installed on the wafer 101a to surround a functional unit 101b, and an encapsulating resin layer 106 filling a circumference of the frame member 102 (FIGS. 1A, 1B, and 2A to 2D).

A gap or void space 107 is formed in a side surface of the frame member 102 and in a surface opposed to the frame member 102 of the encapsulating resin layer 106.

The photo-sensitive element 101 is also electrically coupled to a lead frame 104 through metallic thin lines 105.

Figure 2A:
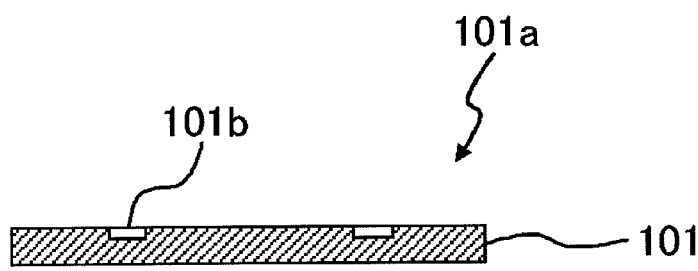
FIGS. 2A to 2D are cross-sectional views, illustrating a process for manufacturing an electronic device in an embodiment.

The photo-sensitive element 101 having a plurality of the functioning sections 101b is formed on the wafer 101a (FIG. 2A). The functioning section 101b is exposed over the surface of the photo-sensitive element 101.

The frame material 102 has a hollow gap, which surrounds the functioning section 101b. The geometry of the frame material 102 in plan view may be, for example, cylindrical, and may also be a polygon having a hollow gap in the center.

The frame material 102 is formed of a first resin. The first resin is a resin, which is capable of being completely cured with a light and/or a heat. More specifically, the frame material 102 is formed by patterning a resin film 102a, which is composed of the first resin in a form of a film.

A height of the frame material 102 is, for example, 0.12 mm. A height of equal to or higher than 0.05 mm is preferable for the height of the frame material 102, and a height of equal to or higher than 0.1 mm is more preferable. Since the height of the frame material 102 can be set to be higher than the height of the metallic thin line 105, an unwanted contact between the metallic thin line 105 coupled to the lead frame 104 from a predetermined position of the photo-sensitive element 101 and the encapsulating metallic mold 111 employed in the manufacture process for the electronic device 108 can be prevented (FIG. 4B). Therefore, an adhesion of the encapsulating metallic mold 111a with the upper surface of the frame material 102 can be achieved, so that a penetration of a resin for forming the encapsulating resin layer 106 (second resin) over the surface of the frame material 102 can be inhibited. The height of the frame material 102 is a dimension in the vertical direction from the surface of the wafer 101a to the upper surface of the frame material 102, and the thickness the thickness of the resin that forms the frame material 102.

The frame material 102 has the upper surface, which is not lower than the height of the upper surface of the encapsulating resin layer 106, and is configured to project upwardly from the encapsulating resin layer 106. The height of the upper surface of the frame material 102 may be higher by 0.01 mm to 0.05 mm from the height of the upper surface of the encapsulating resin layer 106. The difference in the height of not larger than 0.05 mm allows inhibiting a breaking caused by a plastic deformation of the frame material 102, which is caused by increasing an external force by a clamping pressure of the encapsulating metallic mold 111a. On the other hand, the difference in the height of not smaller than 0.01 mm allows preventing a penetration of the encapsulating resin layer 106 in the inside of the frame material 102.

The elastic modulus of the frame material 102 is preferably equal to or higher than 1 GPa and equal to or lower than 6 GPa at 20 degrees C., and equal to or higher than 10 MPa and equal to or lower than 3 GPa at 200 degrees C. The elastic modulus of within a range of from 1 GPa to 6 GPa at 20 degrees C. provides a function for protecting the photo-sensitive element 101 of the electronic device 108. On the other hand, the elastic modulus of within a range of from 10 MPa to 3 GPa at 200 degrees C. provides a protection of the photo-sensitive element 101 to the applied pressure, since the frame material 102 can exhibit a smaller amount of elastic deformation to function as a buffer material during the pressure contact with the encapsulating metallic mold 111 in manufacture process for the electronic device 108.

Further, the elastic deformation can also create a reaction force, which forces the frame material 102 closely contacting with the encapsulating metallic mold 111a. This inhibits a penetration of the encapsulating resin layer 106 to the interior of the frame material 102, or in other words, to an enclosed region created above the functioning section 101b.

In addition to above, the elastic modulus of the frame material 102 is an elastic modulus of the resin composing the frame material 102 in the condition that the resin is completely cured with a light and a heat.

The elastic modulus of the frame member 102 may be suitably adjusted by suitably selecting the type of the resin curable with a light and a heat, the change in the content ratio of the ingredients such as the curing agent, or the manufacturing conditions such as an intensity of the curing light, a curing temperature and the like.

The frame material 102 is formed of a resin (first resin), which is completely curable with a light and/or a heat. The resin, which is completely curable with a light and/or a heat, means a resin containing, for example, a photoreactive resin such as an acrylic resin and a thermosetting resin such as an epoxy resin. Alternatively, the frame material 102 may also formed by patterning a resin film 102a, which is formed as a film.

In such case, the first resin encounters a thermal history in the process for manufacturing the electronic device. Therefore, a surface exposed to a fresh air is oxidized to cause poor adhesion with the second resin.

The encapsulating resin layer 106 is formed of a resin for encapsulation (second resin). The encapsulating resin may contain an inorganic filler, and more specifically a glass filler. This provides an enhanced strength of the encapsulating resin layer 106.

In the next, process for manufacturing an electronic device in first embodiment will be described in reference to FIGS. 2A to 2D, FIGS. 3A to 3C and FIGS. 4A to 4C. FIGS. 2A to 2D, FIGS. 3A to 3C and FIGS. 4A to 4C are cross-sectional views, illustrating a process for manufacturing an electronic device in first embodiment.

A process for manufacturing the electronic device 108 includes: forming the resin film 102a composed of the first resin over the wafer 101a having a plurality of photo-sensitive elements 101 formed therein; pressing a molding surface of the encapsulating metallic mold 111 against the upper surface of the frame material 102 to deform the frame material 102 so as to enlarge the width of the frame material 102; injecting an encapsulating resin (second resin) in the inside of the encapsulating metallic mold 111 while maintaining the deformation of the frame material 102; and disassembling the encapsulating metallic mold 111 to deform the enlarged width of the frame member again, returning to the previous dimension.

First of all, as shown in FIG. 2A, the wafer 101a having a plurality of photo-sensitive elements 101 formed therein is prepared. The functional units 101b are exposed on the surface of the respective photo-sensitive elements 101 disposed in the wafer 101a. In the illustration of FIG. 2A, only two of the photo-sensitive elements 101 disposed in the wafer 101a are shown.

Figure 2B:
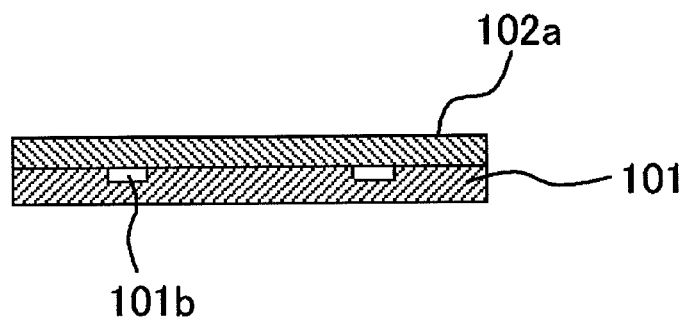

Next, as shown in FIG. 2B, the resin film 102a (first resin) is formed on the wafer 101a. A film having a uniform thickness serving as the resin film 102a covers the entire wafer 101a. The thickness of the resin film 102a is 0.12 mm. The frame member 102 having a height of 0.12 mm is thus obtained.

Figure 2C:
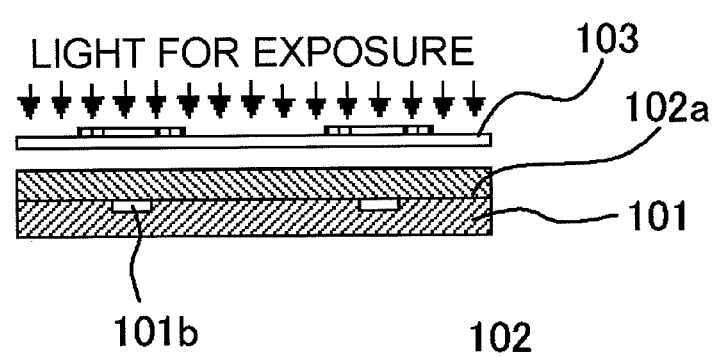

Subsequently, as shown in FIG. 2C, an exposure process is conducted while an alignment is achieved so that the functional unit 101b is fitted into a predetermined position formed in the upper surface of the exposure mask 103.

Figure 2D:
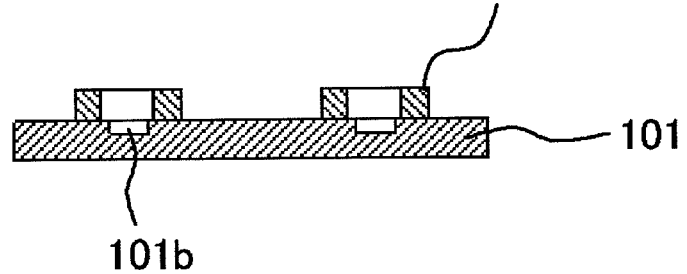

Further, as shown in FIG. 2D, a development processing is conducted. As described above, the frame member 102 is formed so as to be installed to cover the periphery of the functional unit 101b.

In addition to above, since the resin film 102a (first resin) for forming the frame member 102 is not completely cured at the time after the development processing, the frame member 102 and the wafer 101a, or namely the frame member 102 and the photo-sensitive element 101, are adhered with a weak joining force, and not firmly adhered.

Subsequently, as shown in FIG. 2D, the wafer 101a having the frame member 102 formed therein is thermally processed to completely cure the resin film 102a (first resin), so that the frame member 102 and the wafer 101a, or namely the frame member 102 and the photo-sensitive element 101, are firmly adhered. Substantially no geometrical change of the frame member 102 is caused by such thermal processing, the feature of the frame member 102 is substantially the same as the feature of the frame member 102 shown in FIG. 2D.

Figure 3A:
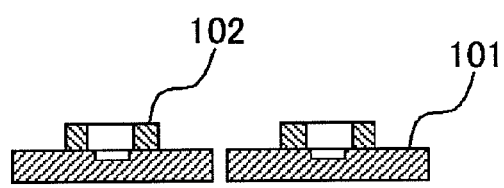
FIGS. 3A to 3C are cross-sectional views, illustrating the process for manufacturing the electronic device in an embodiment.

Then, as shown in FIG. 3A, the wafer 101a is diced into the individual photo-sensitive elements 101 to obtain the photo-sensitive element 101 having the frame member 102. The frame member 102 is formed to be cylindrical.

In the present embodiment, the frame member 102 is adjusted to have the elastic modulus of about 2.4 GPa at an ambient temperature and of about 15 MPa at 200 degrees C. This allows the elastic deformation of the frame material 102, functioning as a buffer material in a pressure contact.

Figure 3B:
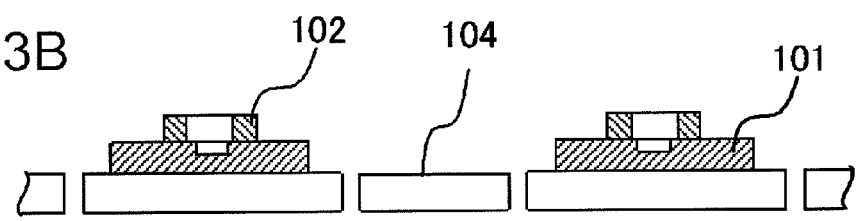
Figure 3C:
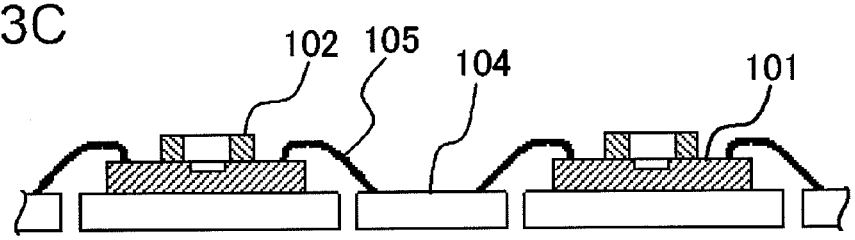

Then, as shown in FIG. 3B, the photo-sensitive element 101 is adhered to a predetermined position on the lead frame 104 via an adhesive agent. Subsequently, as shown in FIG. 3C, the respective predetermined positions of the photo-sensitive element 101 and the lead frame 104 are electrically coupled through the metallic filament 105. In addition to above, the photo-sensitive elements 101 are disposed on the lead frame 104 with a dense arrangement with a predetermined distance.

Figure 4A:
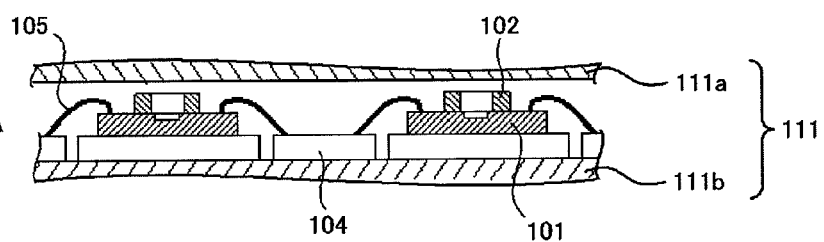
FIGS. 4A to 4C are cross-sectional views, illustrating the process for manufacturing the electronic device in an embodiment.
Figure 4B:
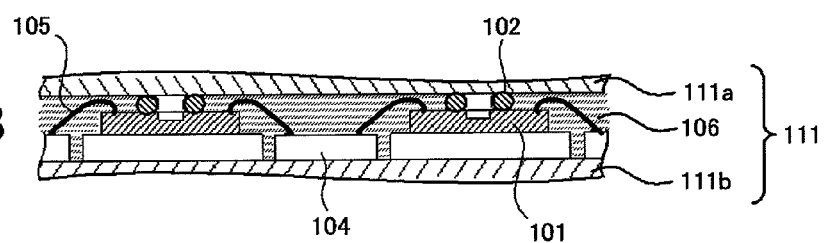

In the next, as shown in FIG. 4A, an encapsulating metallic mold 111 (111a, 111b), each having a molding surface of a flat surface, are prepared, and the photo-sensitive elements 101 on the lead frame 104 as shown in FIG. 3C are fixed to predetermined positions of the encapsulating metallic mold segments 111a and 111b.

Subsequently, the molding surface of the encapsulating metallic mold 111 is pressed against the upper surface of the frame member 102 to deform the frame member 102 so as to enlarge the width of the frame member 102. As shown in FIG. 4B, the upper surface of the frame member 102 is pressed against the molding surface of the encapsulating metallic mold segment 111a, and the molding surface of the encapsulating metallic mold segment 111b is also pressed against the lower surface of the lead frame 104, and a gap between the upper surface of the frame member 102 and the molding surface of the encapsulating metallic mold segment 111a and a gap between the lower surface of the lead frame 104 and the molding surface of the encapsulating metallic mold segment 111b are minimized, and the close contacts of the both are achieved. This allows forming an enclosed region surrounded with the frame member 102 and the encapsulating metallic mold segment 111a above the functional unit 101b.

In such case, the mold fastening of the encapsulating metallic mold segments 111a and 111b is completed in the condition that the frame member 102 is slightly distorted to be deformed so as to enlarge the width of the frame member 102.

Figure 4C:
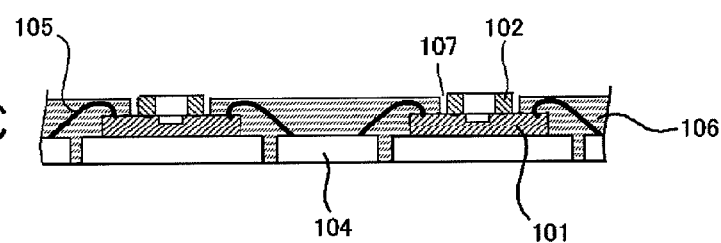

Here, as shown in FIG. 4B, the frame member 102 distorted by a stress along the vertical direction caused by the encapsulating metallic mold segments 111a and 111b can be released from the stressed state by disassembling the encapsulating metallic mold segments 111a and 111b as shown in FIG. 4C, thereby returning to the original shape. In such case, the frame member 102 distorted by a stress along the vertical direction is deformed so as to expand toward a surface direction as shown in FIG. 4B, or in other words toward a direction except the direction of the exerted stress.

Then, the second resin is injected to the cavity of the encapsulating metallic mold 111, while the deformation of the frame member 102 is maintained. More specifically, as shown in FIG. 4B, an encapsulating resin (second resin) melted by a heat is injected into a cavity surrounded by the respective molding surfaces of the encapsulating metallic mold segments 111a and 111b while the pressed condition with the encapsulating metallic mold segment 111 is maintained to form the encapsulating resin layer 106 that fills the periphery of the frame member 102. The encapsulating resin layer 106 fills the circumference of the deformed frame member 102, and is cured and shrunk as it is.

Then, the encapsulating metallic mold segments 111 are disassembled to deform the enlarged width of the frame member 102 again, returning to the previous dimension. As shown in FIG. 4C, when the encapsulating metallic mold segments 111a and 111b are disassembled, the frame material 102 returns to its original geometry, while the encapsulating resin layer 106 still maintains the previous geometry, which follows the deformed geometry of the frame material 102. Therefore, the gap 107 can be created between the frame material 102 and the encapsulating resin layer 106, which corresponds to the deformed or clinched section of the frame material 102. In addition, the upper surface of the frame material 102 is projected slightly from the level of the upper surface of the encapsulating resin layer 106. This allows collectively encapsulating a plurality of photo-sensitive elements 101 disposed on the lead frame 104.

Subsequently, the wafer is diced into the respective photo-sensitive elements 101 to obtain the electronic devices 108 having desired feature (FIGS. 1A and 1B). Here, the electronic device 108 means a device having one of, or both of a passive device and an active device formed in a surface of a semiconductor substrate or a glass substrate.

Advantageous effects of the present embodiment will be described. A stress may be concentrated in the interior of the frame material due to the temperature changes in the conventional electronic device to often cause a breaking-away at the adhesion interface between the frame material and the photo-sensitive element. On the contrary, according to the electronic device 108 of the present embodiment, a gap 107 is present between the frame material 102 and the encapsulating resin layer 106. The presence of the gap 107 allows thermal expansion and thermal shrinkage of the frame member 102 and the encapsulating resin layer 106. Therefore, the stress from the encapsulating resin layer 106 to the frame member 102 is relaxed, so that the stress is hardly accumulated in the inside of the frame member 102. This allows inhibiting the breaking-away at the adhesion interface between the frame material 102 and the photo-sensitive element 101.

Second Embodiment

Figure 5:
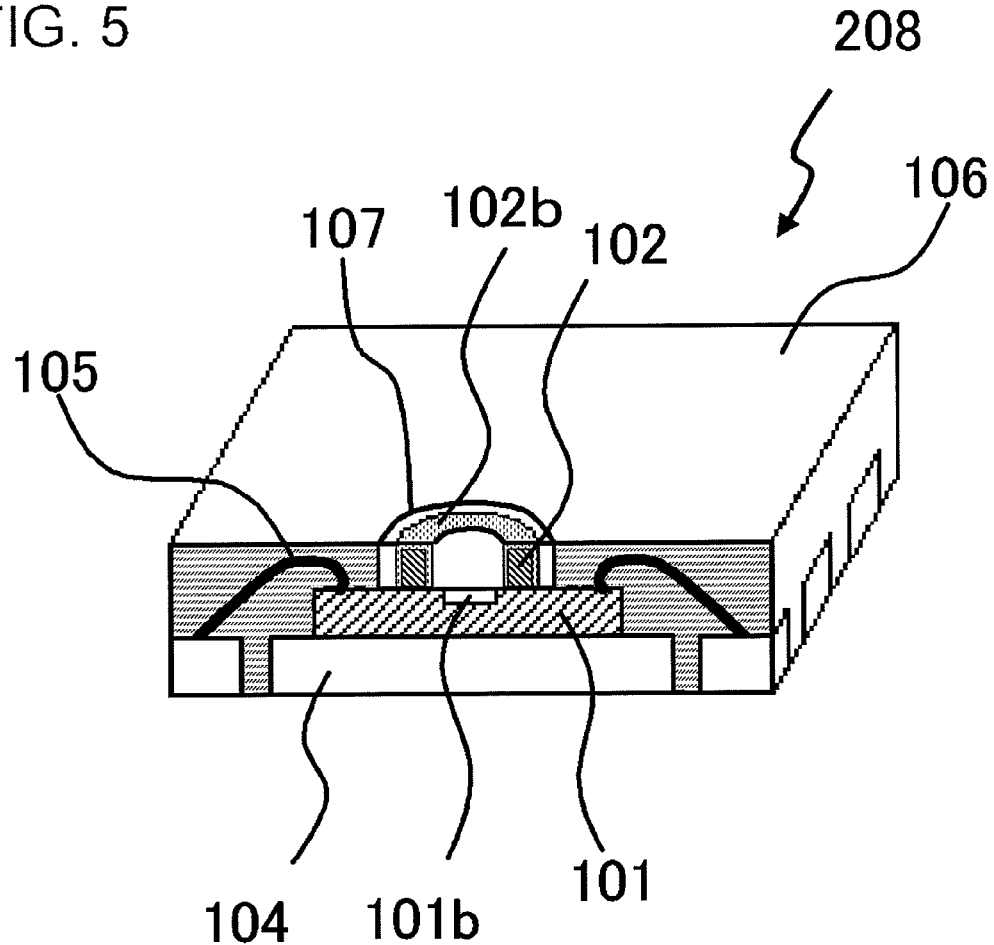
FIG. 5 is a perspective view, illustrating an electronic device according to an embodiment.

FIG. 5 is a cross-sectional view, illustrating an electronic device 208 according to second embodiment. FIGS. 6A and 6B are cross-sectional views, illustrating partial process for manufacturing the electronic device according to second embodiment. The frame material 102 in second embodiment includes an oxide film 102b (low adhesion layer) that has a surface layer having an adhesion for the second resin, which is lower than that of the first resin. In the present embodiment, the oxide film 102b created by oxidizing the surface layer of the frame material 102 functions as the low adhesion layer. Other configurations are substantially the same as in first embodiment.

The oxide film 102b is formed in at least a side surface of the frame material 102. In addition, a material having lower adhesion for the material for forming the encapsulating resin layer 106 (second resin) than that of the material for forming the frame material 102 (first resin) may be preferably employed for the material of the oxide film 102b. This allows easily creating a gap 107 between the frame material 102 and the encapsulating resin layer 106.

The oxide film 102b is formed according to the following process. First of all, as shown in FIG. 2D, frame materials 102 are formed so as to be installed to cover the periphery of the functional unit 101b.

Next, as shown in FIG. 6A, an oxygen plasma treatment is conducted for the frame material 102 to partially oxidize the frame material 102. This allows creating the oxide film 102b in the surface layer of the frame material 102 (FIG. 6B). The adhesion of the oxide film 102b, for the encapsulating resin layer 106 is lower than that of the frame material 102.

Then, similarly as in the above-described embodiment, the wafer 101a is diced into the individual photo-sensitive elements 101 as shown in FIG. 3A, and the obtained photo-sensitive elements 101 are disposed on a lead frame 104. Subsequently, as shown in FIGS. 4A to 4C collective encapsulation of a plurality of photo-sensitive elements 101 disposed on the lead frame 104 is achieved. Subsequently, this is diced to a plurality of devices so as to include one photo-sensitive element 101 to obtain desired electronic devices.

Advantageous effects of the present embodiment will be described. Since the frame material 102 includes the oxide film 102b in the surface layer in the present embodiment, the adhesion of the encapsulating resin layer 106 for the frame material 102 is reduced. More specifically, a wettability between the oxide film 102b and the encapsulating resin layer 106 is reduced. Therefore, when the elastically deformed frame material 102 due to the assemble of the encapsulating metallic mold segments 111a and 111b is return to its former shape, a separation may be easily caused between the frame material 102 and the surrounding encapsulating resin layer 106. This allows more easily creating a gap 107 between the frame material 102 and the encapsulating resin layer 106. Other advantageous effects of the present embodiment are similar as in the above-described embodiment.

Third Embodiment

FIG. 7A is a perspective view, illustrating an electronic device according to third embodiment, and FIG. 7B is a cross-sectional view along line A-A' in FIG. 7A. While the frame material 102 having a cylindrical shape is described in first embodiment, a frame material 302 of third embodiment has a tapered or an inverse trapezoid of the cross-sectional profile, in which the width is decreased as approaching the bottom section. Other configurations are substantially the same as in first embodiment.

The frame material 302 has an outer profile, in which the dimensional area of the upper surface is larger than the dimensional area of the lower surface. In addition, a cross-sectional profile of the frame material 302 is an inverse trapezoid, in which the width is decreased as approaching to the bottom section, as shown in FIG. 7B. In addition, the cross-sectional view includes two inversely tapered shapes disposed across an inner space.

The frame material 302 is formed according to the following process. First of all, as shown in FIGS. 2A and 2B, the resin film 102a is formed on the wafer 101a similarly as in first embodiment.

Subsequently, as shown in FIG. 2C, an alignment is achieved so that the functional unit 101b is fitted into a predetermined position formed in the upper surface of the exposure mask 103. A mask having a pattern of the frame material 302 is provided on resin film 102a, and an exposure and a development are conducted for the resin film 102a with scattered light to form the frame material 302.

On this occasion, since scattered light is employed, a light component having larger incidence angle is irradiated over the upper section of the resin film 102a around the masked sections of the mask 103 for exposure. On the other hand, light components in the scattered light having larger incident angles are difficult to be reached as approaching the bottom section of the resin film 102a. In addition, light components having smaller incident angles can reach the lower section of the resin film 102a in accordance with the opening of the mask 103 for exposure.

More specifically, larger dimensional area of the region than the opening region of the mask 103 for exposure can be irradiated with light in the upper section of the resin film 102a, and the dimensional area of the region irradiated with light approaches to be closer to the dimensional area of the opening region of the mask 103 for exposure as approaching the lower section. As a consequence, the frame material 302 having a profile, in which the dimensional area of the upper surface of the frame material 102 is larger than the dimensional area of the lower surface of the frame material 102, can be formed. In the present embodiment, a cross-sectional profile of the frame material 302 is an inverse trapezoid, in which the width is decreased as approaching to the bottom section.

As described above, after forming the frame material 302 on the wafer 101a, the wafer 101a is diced into individual photo-sensitive elements 101 and the diced photo-sensitive element 101 is disposed on the lead frame 104, similarly as in the above-described embodiment (FIG. 3B). Subsequently, as shown in FIGS. 4A to 4C collective encapsulation of a plurality of photo-sensitive elements 101 disposed on the lead frame 104 is achieved. Subsequently, this is diced to a plurality of devices so as to include one photo-sensitive element 101 to obtain desired electronic devices.

Advantageous effects of the present embodiment will be described. In the present embodiment, the dimensional area of the upper surface of the frame material 302 is larger than the dimensional area of the lower surface. This allows providing smaller size of the photo-sensitive element 101, since the adhesion surface of the frame material 302 with the photo-sensitive element 101 is smaller, as compared with the case that the dimensional area of the upper surface of the frame material is provided to be equivalent to the dimensional area of the frame material 102 of first embodiment. Other advantageous effects of the present embodiment are similar as in the above-described embodiment.

Fourth Embodiment

Figure 8A:
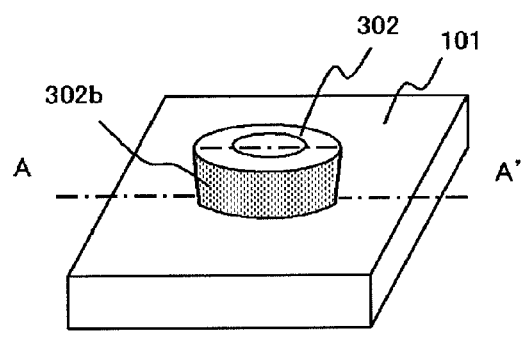
FIG. 8A is a perspective view, illustrating an electronic device in an embodiment.
Figure 8B:
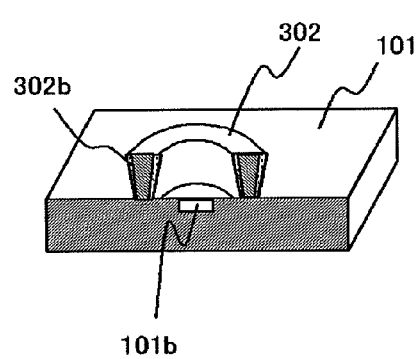
FIG. 8B is a cross-sectional view along line A-A' shown in FIG. 8A.
Figure 9:
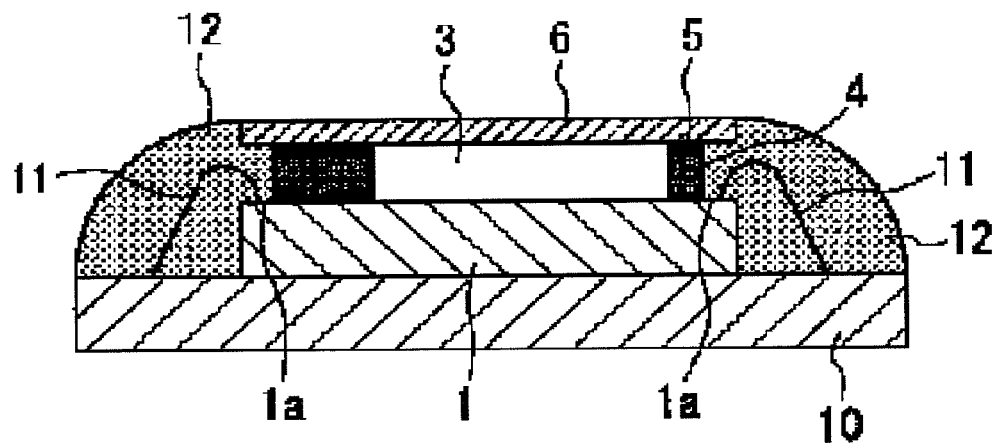
FIG. 9 is a cross-sectional view, illustrating a conventional electronic device.

FIG. 8A is a perspective view, illustrating an electronic device according to fourth embodiment, and FIG. 8B is a cross-sectional view along line A-A' in FIG. 8A. An exemplary implementation, in which an oxide film is formed in a side surface of the frame material 302b of third embodiment, will be described in fourth embodiment. Other configurations are substantially the same as in third embodiment.

The frame material 302 is formed on the wafer 101a, similarly as in the above-described third embodiment. Subsequently, an oxygen plasma treatment is carried out for the formed frame material 302. This allows forming an oxide film 302b in a surface layer of the frame material 302. Then, the wafer 101a is diced into the individual photo-sensitive elements 101 to obtain the photo-sensitive element 101 having the frame member 102.

Then, as shown in FIG. 3B, the photo-sensitive element 101 is adhered to a predetermined position on the lead frame 104 via an adhesive agent.

Next, the surface of the wafer 101a and the upper surface of the frame material 302 are cleaned with a plasma. More specifically, an argon plasma treatment is conducted as a pre-conditioning treatment for the wire bonding process shown in FIG. 3C. Such argon plasma treatment is a treatment for cleaning the frame material 302, and the treatment allows removing oxide films 302b formed on the upper surface of the frame material 302 (see FIG. 8B). In addition, the argon plasma treatment is an anisotropic process.

Since the frame material 302 is an inverse-trapezoid shaped, in which the width is decreased as approaching to the bottom section, the side surface of the frame material 302 is sloped toward downward and inward. In such configuration, the anisotropic argon plasma treatment is not achieved over the side surface of the frame material 302. Therefore, the removal of the oxide film 302b formed in the side surface of the frame material 302 is avoided, even if an anisotropic argon plasma treatment is employed (see FIG. 8B).

Then, similarly as in the above-described embodiment, the respective predetermined positions of the photo-sensitive element 101 and the lead frame 104 are electrically coupled through the metallic filament 105, and then, the wafer 101a is diced into the individual photo-sensitive elements 101, and the obtained individual elements are disposed on the lead frame 104 (FIG. 3B). Subsequently, as shown in FIGS. 4A to 4C collective encapsulation of a plurality of photo-sensitive elements 101 disposed on the lead frame 104 is achieved. Subsequently, this is diced to a plurality of devices so as to include one photo-sensitive element 101 to obtain desired electronic devices.

Advantageous effects of the present embodiment will be described. The configuration of the present embodiment avoids a removal of the oxide film 302b formed in the side surface of the frame material 302, even if an argon plasma treatment is carried out as a pre-conditioning treatment for the wire bonding process, since the frame material 302 is an inverse-trapezoid shaped, in which the width is decreased as approaching to the bottom section. Therefore, even if a periphery of the frame material 302 is then filled with the encapsulating resin layer 106, the side surface and the encapsulating resin layer 106 is hardly adhered to the frame material 302, since the wettability of the oxide film 302b and the encapsulating resin layer 106 is lower. This allows easily creating a gap between the frame material 302 and the encapsulating resin layer 106.

The configuration of the electronic device according to the present invention is not limited to the above-described embodiments, and various modifications are also available.

While the oxide film 102b is formed via the oxygen plasma treatment for the frame materials 102 and 302 in the above-described embodiments, the oxide film may alternatively be created via a baking process for the frame material 102 or 302 within an oxygen atmosphere. Alternatively, a material exhibiting no adhesion with the encapsulating resin may be applied or deposited over the surface of the frame material 102 or 302.

While the exemplary implementations for forming the frame material 302 by utilizing scattered light has been described in the above-described embodiment, other method may also be employed. For example, a chemically amplifying type material may alternatively be employed for the resin film 102a in the development and baking treatment illustrated in FIG. 2D, and the development process may be carried out for longer duration time, so that an over-etching is caused to form a frame material having an inversely-tapered shape as described above.

Further, other method may also be employed, in which a lower baking temperature may be employed or shorter baking time may be employed in the baking treatment after the exposure, so that unreacted sections are remained in the side of the bottom surface serving as adhesive section with the photo-sensitive element 101 of resin film 102a, allowing easily creating the frame material 302 of an inversely tapered shape in the later development treatment process.

Further, a protective tape covering an upper surface of the frame member 102 or the frame member 302 and an upper surface of the encapsulating resin layer 106 may be formed. The protective tape is capable of protecting the exposed functional unit 101b. While a material for the protective tape is not particularly limited, a strippable resin exhibiting a thermal resistance at a temperature higher than the reflow temperature may be typically employed.

Alternatively, besides the use of the protective tape, a transparent glass plate may be provided over the upper surface of the frame member 102 or the frame member 302, or over the upper surface of the encapsulating resin layer 106. The use of the glass plate eliminates a need for removing the plate.

While the exemplary implementation employing the resin film 102a having the thickness of 0.12 mm is illustrated in the present embodiment, the thickness of the resin film 102a may be suitably adjusted, and larger thickness of the resin film 102a may be employed, when the height of the frame member 102 or 302 is set to equal to or larger than 0.12 mm.

While the exemplary implementation employing the photo-sensitive element 101 for the digital video disc as the electronic element is illustrated in the above-described respective embodiments, imaging devices for the use in, for example, a digital video camera or a digital still camera, may also be preferable.

While the wafer 101a is described as a lead frame in the above-described embodiment, the wafer is not limited to the lead frame, and, for example, a resin substrate or a film-form substrate may also be applied.

It is apparent that the present invention is not limited to the above embodiment, and may be modified and changed without departing from the scope and spirit of the invention.

What is claimed is:

1. An electronic device, comprising:
   an element formed in a wafer;
   a frame member, composed of a first resin and installed over said wafer to surround a functional unit of said element; and
   a resin layer, composed of a second resin, and provided around a perimeter of said frame member so that a gap is present between said frame member and said resin layer,
   wherein the frame member does not overlap with the resin layer when viewed from a direction normal to a topmost surface of the wafer,
   wherein the gap is a void space having no material therein, and
   wherein said functional unit of said element is exposed in a space surrounded by said frame member, said space extending to at least an upper surface of said frame member.

2. The electronic device as set forth in claim 1, further comprising a low adhesion layer disposed in at least side surface of said frame member, said low adhesion layer having higher adhesion for said second resin than said first resin.

3. The electronic device as set forth in claim 1, wherein said low adhesion layer is an oxide film created by oxidizing a surface layer of said frame member.

4. The electronic device as set forth in claim 1, wherein
   a dimensional area of an upper surface of said frame member is larger than a dimensional area of a lower surface of said frame member.

5. The electronic device as set forth in claim 4, wherein a width in a cross-sectional geometry of said frame member is decreased toward the lower section.

6. The electronic device as set forth in claim 1, wherein all portions of the resin layer are disposed outside the perimeter of said frame member.

7. The electronic device as set forth in claim 1, wherein the resin layer does not overlap with the functional unit when viewed from a direction normal to the topmost surface of the wafer.

8. The electronic device as set forth in claim 1, wherein the frame member does not overlap with the functional unit when viewed from a direction normal to the topmost surface of the wafer.

9. The electronic device as set forth in claim 1, wherein a linear expansion coefficient of the frame member is different from a linear expansion coefficient of the resin layer.

10. The electronic device as set forth in claim 1, wherein the gap is configured to allow thermal expansion and thermal shrinkage of the frame member and the resin layer.

11. The electronic device as set forth in claim 1, wherein the gap is configured to substantially eliminate stress exerted by the resin layer to the frame member due to thermal expansion and thermal shrinkage of the frame member and the resin layer.

12. The electronic device as set forth in claim 1, wherein an topmost surface of the frame member is not more than 0.05 mm higher than an topmost surface of the resin layer in a direction normal to the topmost surface of the wafer.

* * * * *